United States Patent [19]

Kennedy et al.

[11] Patent Number: 4,637,066
[45] Date of Patent: Jan. 13, 1987

[54] NOISE BLANKING SIGNAL GENERATOR FOR AM RADIO

[75] Inventors: Richard A. Kennedy; Fredrick A. Aldridge, both of Russiaville, Ind.

[73] Assignee: General Motors Corporation, Detroit, Mich.

[21] Appl. No.: 751,207

[22] Filed: Jul. 2, 1985

[51] Int. Cl.$^4$ .............................................. H04B 1/10
[52] U.S. Cl. .................... 455/223; 455/225; 455/221; 455/303
[58] Field of Search ............... 455/221, 223, 225, 220, 455/222, 224, 303; 375/104; 328/165

[56] References Cited

U.S. PATENT DOCUMENTS

| | | | |
|---|---|---|---|
| 4,044,309 | 8/1977 | Smith | 455/221 |
| 4,053,843 | 10/1977 | Wright et al. | |
| 4,300,104 | 11/1981 | Tanaka et al. | 330/280 |
| 4,327,446 | 4/1982 | Dressler | 455/223 |
| 4,342,120 | 7/1982 | Settlemire et al. | 455/222 |

Primary Examiner—Jin F. Ng
Assistant Examiner—Elissa Seidenglanz
Attorney, Agent, or Firm—Robert M. Sigler

[57] ABSTRACT

A noise blanking signal generator for an AM radio receiver includes a product detector adapted to receive an IF signal modulated by an AF signal and synchronously detect the AF signal, a first low pass filter adapted to derive from the product detector a filtered voltage indicating the average IF signal strength, a second low pass filter adapted to derive from the product detector an AF signal voltage and a reference voltage generating circuit ratiometrically related to the product detector through a common DC power supply and effective to generate a reference voltage substantially equal to the filtered voltage in the absence of an IF signal. A voltage divider comprising a pair of resistors connected in series across the outputs of the first and second low pass filters has an output at the junction of the resistors, the resistors being of such ratio as to generate, when the AF signal equals a predetermined modulation level with reference to the IF signal strength, a voltage equal to the reference voltage at the voltage divider output, a comparator effective to compare the voltage at the output of the voltage divider with the reference voltage and generate a noise blanking signal when the former exceeds the latter and offset means effective to bias the comparator do not generate the noise blanking signal when the voltage at the output of the voltage generator does not exceed the reference voltage.

4 Claims, 2 Drawing Figures

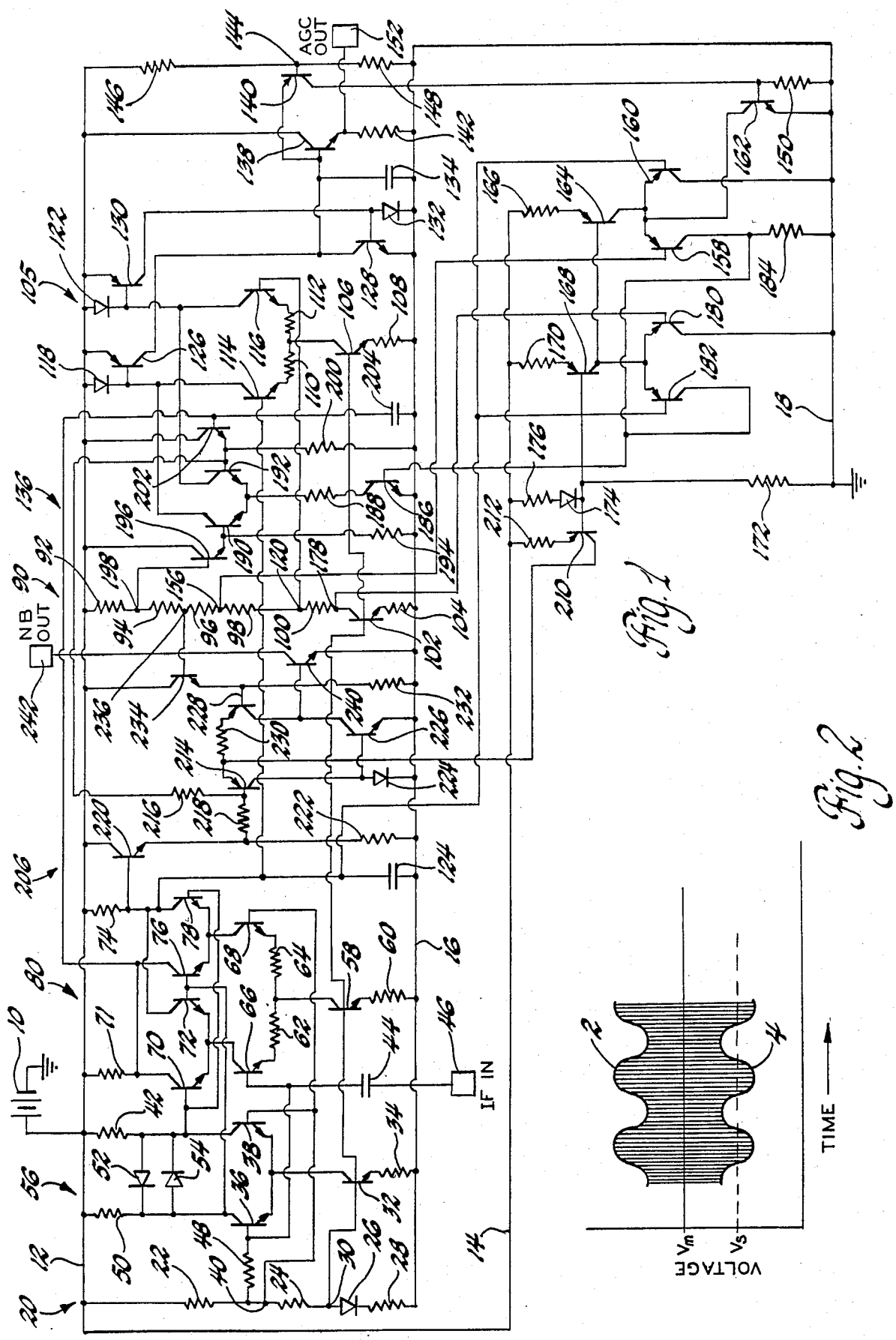

NOISE BLANKING SIGNAL GENERATOR FOR AM RADIO

SUMMARY OF THE INVENTION

This invention relates to an AM radio with noise blanking capability and particularly an AM radio including a circuit effective to detect noise pulses and generate noise blanking signals for use by other circuitry to blank the noise pulses.

Noise blanking circuits are known which include a separate AGC circuit to maintain a substantially constant reference level against which to compare the audio signal to detect noise pulses. One such circuit, for example, uses two differential comparators, one having a current source transistor with twice the emitter area of the current source transistor of the other for twice the gain or sensitivity. Each comparator compares the IF signal, including noise pulses, with a fixed reference; however, the output of the more sensitive comparator has an associated AGC circuit which simultaneously controls the current levels of both current source transistors and therefore the gain of both comparators. The AGC circuit maintains a relatively stable situation in the comparators; and when the signal exceeds the reference in the less sensitive comparator an output noise blanking signal is generated. However, the AGC circuit of the prior art noise blanking circuit is different from the IF AGC circuit of the receiver and must be designed to track the latter over the dynamic range of the incoming signal. In addition, the noise detecting threshold depends upon an emitter ratio.

The circuit of this invention is a noise detecting and blanking signal generating circuit which is integrated to a high degree with the AGC circuit of the receiver for optimum performance. The circuit derives voltages representing average IF signal strength and audio signal from a product detector and generates a reference voltage indicating a predetermined modulation index from a voltage divider ratiometric with the product detector. The AGC voltage generating circuit uses reference voltages generated in the same voltage divider and the same voltage representing average IF signal strength. The predetermined modulation index may be chosen to be the maximum allowable modulation for AM broadcasters so that any greater modulation may be assumed to be noise. In addition to the tracking of the AGC and noise blanking signal generating circuits, the threshold level for noise blanking is determined by a resistor ratio rather than the less controllable emitter ratios found in the above described prior art circuit.

The circuit comprises a product detector adapted to receive an IF signal modulated by an AF signal and synchronously detect the AF signal, a first low pass filter adapted to derive from the product detector a filtered voltage indicating the average IF signal strength, a second low pass filter adapted to derive from the product detector an AF signal voltage, a reference voltage generating circuit ratiometrically related to the product detector through a common DC power supply and effective to generate a reference voltage substantially equal to the filtered voltage in the absence of an IF signal, a voltage divider comprising a pair of resistors connected in series across the outputs of the first and second low pass filters and having an output at the junction of the resistors, the resistors being of such ratio as to generate at the voltage divider output, for a predetermined modulation index of the IF signal modulated by the AF signal, a voltage equal to the reference voltage, a comparator effective to compare the voltage at the output of the voltage divider with the reference voltage and generate a noise blanking signal when the former exceeds the latter and offset means effective to bias the comparator to not generate the noise blanking signal when the voltage at the output of the voltage generator does not exceed the reference voltage.

Further details and advantages will be apparent from the accompanying drawings and following description of a preferred embodiment.

SUMMARY OF THE DRAWINGS

FIG. 1 is a circuit diagram of a portion of an AM receiver including this invention.

FIG. 2 is a signal waveform from the product detector of the AM receiver of FIG. 1.

DESCRIPTION OF THE PREFERRED EMBODIMENT

FIG. 1 shows the circuit diagram of a portion of an AM radio receiver chip including IF limiter, balanced modulator, AGC generator, AGC speedup, and noise blanking signal generating circuitry. The circuitry is powered from a nominal 8 volt DC supply 10 through positive supply rails 12, 14 and ground lines 16, 18.

A first voltage divider 20 provides reference voltages for the IF limiter 56 and balanced modulator 80. Voltage divider 20 comprises, in order from supply rail 12 to ground 16, resistor 22, resistor 24, diode 26 and resistor 28. Junction 30 of the anode of diode 26 and resistor 28 is connected to the base of an NPN current source transistor 32 having an emitter connected through a resistor 34 to ground 16 and a collector connected to the emitters of NPN transistors 36 and 38. Transistor 38 has a base connected to junction 40 of resistors 22 and 24 and a collector connected through a resistor 42 to supply rail 12. Transistor 36 has a base connected through a capacitor 44 to an IF signal input terminal 46 and further connected through a resistor 48 to junction 40 of voltage divider 20. The collector of transistor 36 is connected through a resistor 50 to supply rail 12. A pair of diodes 52, 54 are connected in parallel in opposing conductivity direction between the collectors of transistors 36 and 38. These transistors and their associated elements comprise the IF limiter 56.

The base of transistor 32 is connected to the base of an NPN common current source transistor 58 with an emitter connected through a resistor 60 to ground 16 and a collector connected through resistors 62 and 64, respectively, to the emitters of NPN transistors 66 and 68. Transistor 66 has a base connected through capacitor 44 to IF input terminal 46 and a collector connected to the emitter of an NPN transistor 70 having a collector connected through a load resistor 71 to supply rail 12 and a base connected to the collector of transistor 38. The collector of transistor 66 is further connected to the emitter of an NPN transistor 72 having a base connected to the collector of transistor 36 and a collector connected through a load resistor 74 to supply rail 12. Load resistors 71 and 74 are equal in resistance. Transistor 68 has a base connected to junction 40 of voltage divider 20 and a collector connected to the emitters of NPN transistors 76 and 78. Transistor 76 has a base connected to the base of transistor 72 and a collector connected to the collector of transistor 70; while transistor 78 has a base connected to the base of transistor 70 and a collector connected to the collector of transistor 72. Transistors 66, 68, 70, 72, 76 and 78 and their associated components comprise a balanced modulator or multiplier 80 which, in conjunction with IF limiter 56, acts as a product detector for a signal applied on an input terminal comprising the base of transistor 66, the other input terminal, the base of transistor 68, being supplied a reference voltage from voltage divider 20. The IF signal is clipped by IF limiter 56 to form a signal suitable for synchronous detection when multiplied with the IF signal in balanced modulator 80. The output of the product detector may be obtained from either the common output of transistors 70 and 76 or from the common output of transistors 72 and 78.

The waveforms of the outputs of balanced modulator 80 can be seen in FIG. 2. The IF signal waveform is shown on a time scale which shows the upper and lower audio frequency envelopes 2 and 4, which are symmetrical about a positive intermediate or reference voltage $V_m$, typically 6.0 volts. The actual IF oscillations are too constricted on the time scale to be accurately represented in FIG. 2 and are thus represented by the vertical lines between the envelopes. The upper envelope 2 is available on the collectors of transistors 70, 76; and the lower envelope 4 is available on the collectors of transistors 72, 78.

A single voltage divider 90 generates reference voltages for the AGC detector, AGC speedup and noise blanker signal generating circuits. Voltage divider 90 comprises, in order from supply rail 12 to ground 16, resistors 92, 94, 96, 98, 100, NPN transistor 102 and resistor 104. Current source transistor 102 has a base connected to the base of transistor 58, an emitter connected to resistor 104 and a collector connected to resistor 100. A feature of this circuitry is that all reference voltages for AGC and noise blanker signal generating are derived from a single voltage divider 90 and are thus ratiometric, while all signal voltages for the same functions are derived from the product detector. In addition, the product detector and voltage divider are also ratiometrically related in that each is driven by a current source coupled to that of the other and in that the load resistors of balanced modulator 80 are specifically related in resistance to the resistors of voltage divider 90, as will be described below at a later point. This ensures accurate tracking of the signals in spite of changes in supply voltage, temperature, etc.

The AGC generator 105 includes an NPN current source transistor 106 having a base connected to the base of transistor 102, an emitter connected through a resistor 108 to ground 16 and a collector connected through resistors 110 and 112, respectively, to the emitters of NPN transistors 114 and 116. Transistor 114 has a base connected to the collector of transistor 78 and a collector connected through a diode 118 to supply rail 12. Transistor 116 has a base connected to the junction 120 of resistors 98 and 100 and a collector connected through a diode 122 to supply rail 12. A capacitor 124 is connected between the collector of transistor 78 and ground 16. Capacitor 124 low pass filters the IF signal on the collector of transistor 78 to provide to the base of transistor 114 an IF DC signal component which is a function of IF signal strength. Capacitor 124 provides low pass filtering with a time constant of 10–20 Hertz, which results in an almost constant voltage level $V_s$, the IF DC signal component which indicates the average IF signal strength and is shown as a dashed line in FIG. 2. As IF signal strength decreases, $V_s$ moves upward toward $V_m$; and as IF signal strength increases, $V_s$ moves downward away from $V_m$. The base of transistor 116, however, receives a constant reference voltage from voltage divider 90. Current source transistors 58 and 102 provide equal current outputs. Resistors 92 and 94 in series have a combined resistance half that of resistor 74, which makes up for the double current flowing therethrough, compared to that through resistor 74, and provides equal voltage drops across resistors 92, 94 on one hand and resistor 74 on the other. Thus a reference voltage of 6.0 volts appears on junction 236 of resistors 94 and 96. A reference voltage of, typically, 5.8 volts appears on junction 120. This is lower by an offset of 0.2 volts than the intermediate voltage of 6.0 volts referred to above, and represents a desired average IF signal strength. Transistors 114 and 116 form a differential comparator. With no IF signal, therefore, transistor 114 will be conducting and transistor 116 shut off. However, as IF signal strength increases, the filtered voltage from the collector of transistor 78 decreases toward ground; and, at some point, transistor 116 will begin to conduct and transistor 114 to shut off.

AGC generator 105 further includes a PNP transistor 126 having an emitter connected to supply rail 12, a base connected to the cathode of diode 118 and the collector of transistor 114 and a collector connected through an NPN transistor 128 to ground 16. A PNP transistor 130 has an emitter connected to supply rail 12, a base connected to the cathode of diode 122 and the collector of transistor 116 and a collector connected through a diode 132 to ground 16, the anode of diode 132 being connected to the base of the grounded emitter transistor 128. Diodes 118, 122 and transistors 126, 130 form current mirrors for transistors 114, 116, respectively.

The collector of transistor 128 is further connected through a capacitor 134 to ground 16 and also connected to the base of an NPN transistor 138 and to the emitter of a PNP transistor 140. Transistor 138 has an emitter connected through a resistor 142 to ground 16 and a collector connected to supply rail 12. Transistor 140 has a base connected to the junction 144 of a voltage divider comprising resistors 146 and 148 between supply rail 12 and ground 16. The collector of transistor 140 is connected through a resistor 150 to ground 18. Terminal 152, connected to the emitter of transistor 138, provides an output for the AGC voltage, which is derived on the emitter of transistor 138 in a manner to be described immediately below.

As mentioned above, with a small IF signal transistor 114 is conducting and transistor 116 is turned off. Under these conditions, transistor 126 serves as a current source and charges capacitor 134 to a voltage one base-emitter voltage drop above the reference voltage obtained at the base of transistor 140 from the voltage divider comprising resistors 146, 148. As the voltage on capacitor 134 attempts to increase beyond that voltage, transistor 140 conducts as necessary to so limit the voltage. The voltage on capacitor 134 is translated down one base-emitter voltage drop through transistor 138 to become the AGC voltage available on terminal 152, the maximum AGC voltage thus being equal to the voltage at junction 144 of resistors 146 and 148. The AGC voltage is supplied to AGC elements not shown but well known in the art to maximize the gain of the IF amplifier. IF output signal is allowed to increase until the voltage on capacitor 124 is approximately equal to the reference voltage at junction 120; and transistors 114 and 116 steer mirror current to transistor 130 rather than transistor 126. Transistor 130 serves as a current source to turn on transistor 128. The charging current for capacitor 134 is reduced; and a discharge path is opened as transistor 128 drains charge from capacitor 134. The output AGC voltage thus decreases to maintain signal strength at the IF output to the desired level. This level is ultimately controlled by the ratio of resistor 74 in product detector 80 to the resistance sum of resistors 92, 94, 96 and 98 in voltage divider 90.

Additional elements provide for AGC speedup under predetermined conditions. The AGC speedup circuit 136 is a current source control which uses resistors 98 and 100 to define a voltage window around the reference voltage of 5.8 volts at junction 120 of voltage divider 90. A slightly higher reference voltage such as 5.9 volts is provided from junction 156 of resistors 96, 98 to the base of a PNP transistor 158 having an emitter connected to the emitter of another PNP transistor 160. The emitters of transistors 158 and 160 are connected to the collector of an NPN switch transistor 162 having a base connected to the collector of transistor 140 and an emitter connected to ground 18. The emitters of transistors 158 and 160 are further connected to the collector of a PNP current source transistor 164 having an emitter connected through a resistor 166 to supply rail 14 and a base connected to the base of another PNP current source transistor 168 having an emitter connected through a resistor 170 to supply rail 14. The base of transistor 168 is connected through a resistor 172 to ground 18 and to the cathode of a diode 174 having an anode connected through a resistor 176 to supply rail 14.

A slightly lower reference voltage such as 5.7 volts is provided from junction 178 of resistor 100 and the collector of transistor 102 to the base of a PNP transistor 180 having an emitter connected to the emitter of a PNP transistor 182, the common emitters of transistors 180, 182 being connected to the collector of transistor 168. The collectors of transistors 160 and 180, are connected to ground 18. The collectors of transistors 158 and 182 are connected to ground 18 through a resistor 184 and further connected to the base of an NPN current source transistor 186 having an emitter connected to ground 16 and further having a collector connected through a resistor 188 to the common emitters of NPN transistors 190 and 192. Transistor 190 has a collector connected to the collector of transistor 114 and a base connected to ground 16 through a resistor 194. The base of transistor 190 is further connected to the emitter of an NPN transistor 196 having a collector connected to supply rail 12 and a base connected to junction 198 of resistors 92 and 94 in voltage divider 90. Transistor 192 has a collector connected to the collector of transistor 116 and a base connected through a resistor 200 to ground 16. The base of transistor 192 is further connected to the emitter of an NPN transistor 202 having a collector connected to supply rail 12 and a base connected through a capacitor 204 to ground. The base of transistor 202 is further connected to the collectors of transistors 70 and 76 of product detector 80. The reference voltage available at junction 198 of resistors 92 and 94 must be set higher than the intermediate voltage of 6.0 volts by the same offset voltage by which the voltage at junction 120 is lower than the intermediate voltage. In this example it is set at 6.2 volts.

In operation, transistors 158, 160 and transistors 180, 182 comprise a pair of differential comparators effective to compare the filtered DC component of the IF signal from capacitor 124 with the high and low window reference voltages obtained from junctions 156 and 178 of voltage divider 90. As long as the filtered IF DC signal component is within the voltage window, current source transistor 186 is turned off to deactvate transistors 190, 192; and a "slow" AGC voltage is generated as described above. In this mode, the AGC voltage responds minimally to audio frequency signal variations for minimum THD performance. However, when the filtered IF DC signal component goes out of the window, either high or low, transistor 186 is turned on by the conduction of one of transistors 158 and 182. Transistor 186 then acts as a current source for transistors 190 and 192 to draw approximately 20 times more current through the one of transistors 126 and 130 that is conducting to provide faster charging or discharging of capacitor 134 and thus a "fast" AGC voltage from transistor 138. In this mode, the system can respond quickly to prevent loss of audio output when a vehicle mounted AM radio is driven under an RF signal obstructing obstruction and the signal level suddenly falls. In addition, if the radio is equipped with a signal seeking or scanning tuner of the type which monitors AGC voltage for evidence of a tunable signal, the AGC voltage will increase quickly when such a signal is encountered in a frequency scan for reliable detection and tuning. When the filtered IF DC signal component returns to the voltage window, transistor 186 is once again turned off to return to "slow" AGC for minimum THD performance. To prevent "fast" AGC being triggered by the lack of an IF signal, the high voltage on capacitor 134 under no signal conditions causes switch transistor 162 to be turned on through transistor 140; and transistor 162 holds the comparators in the "slow" AGC condition until the IF DC signal component rises to a predetermined voltage.

The noise blanking signal generating circuitry 206 is tied in to the same signals and reference voltages as the AGC and AGC speedup circuits. A PNP current source transistor 210 has an emitter connected through a resistor 212 to supply rail 14, a base connected to the base of transistor 168 and a collector connected to the emitter of a PNP transistor 214. Transistor 214 has a base connected through a resistor 216 to the base of transistor 192 and through a resistor 218 to the emitter of an NPN transistor 220 having a collector connected to supply rail 12 and a base connected to the collector of transistor 78. The emitter of transistor 220 is further connected through a resistor 222 to ground 16. The collector of transistor 214 is connected through a diode 224 to ground 16 and also to the base of an NPN transistor 226 having an emitter grounded at 16 and a collector connected to the collector of a PNP transistor 228. Transistor 228 has an emitter connected through a resistor 230 to the emitter of transistor 214 and a base connected through a resistor 232 to ground 16. The base of transistor 228 is further connected to the emitter of an NPN transistor 234 having a collector connected to supply rail 12 and a base connected to junction 236 of resistors 94 and 96 in voltage divider 90. The collectors of transistors 226 and 228 are further connected to the base of an NPN transistor 240 having an emitter connected to ground 16 and a collector providing noise blanking pulse signals on a terminal 242.

In operation, the comparator comprising transistors 214 and 228 compares the voltage at the junction of resistors 216 and 218 with a reference voltage derived from junction 236 of voltage divider 90. Under low modulation signal conditions, the offset of resistor 230 causes transistors 228 and 240 to be off and transistor 226 to be on. Capacitor 204 low pass filters the uppergoing portion of the IF signal from transistors 70 and 76 of product detector 80. However, capacitor 204 has a capacitance which produces a time constant such as 10 Kilohertz, which suppresses the intermediate frequency but passes the audio frequencies, including audible noise spikes. This audio signal component is combined with the IF DC signal component in resistors 216 and 218. These resistors form a voltage divider between the two low pass filters to produce a predetermined voltage ratio of the downward going voltage indicating average IF signal strength and the upward going audio signal voltage. This ratio is set at $(1+m)/1$, where m is the modulation index of the threshold of noise. A preferred value for m is 1.25, representing 125% modulation. The comparator switches transistor 240 on when the audio signal component exceeds 125 percent modulation, since this is the maximum allowable AM modulation for AM broadcasters and anything exceeding this is assumed to be noise. Transistor 240 stays on for the duration of the noise and then immediately turns off again, thus providing a noise blanking pulse on terminal 242 for application to noise blanking circuitry not shown but well known in the art.

The embodiments of the invention in which an exclusive property or privilege is claimed are defined as follows:

1. A noise blanking signal generator for an AM radio receiver, comprising, in combination:
   a product detector adapted to receive an IF signal modulated by an AF signal and synchronously detect the AF signal;
   a first low pass filter adapted to derive from the product detector a filtered voltage indicating the average IF signal strength;
   a second low pass filter adapted to derive from the product detector an AF signal voltage;
   a reference voltage generating circuit ratiometrically related to the product detector through a common DC power supply and effective to generate a reference voltage substantially equal to the filtered voltage in the absence of an IF signal;
   a voltage divider comprising a pair of resistors connected in series across the outputs of the first and second low pass filters and having an output at the junction of the resistors, the resistors being of such ratio as to generate at the voltage divider output, for a predetermined modulation index of the IF signal modulated by the AF signal, a voltage equal to the reference voltage;
   a comparator effective to compare the voltage at the output of the voltage divider with the reference voltage and generate a noise blanking signal when the former exceeds the latter; and
   offset means effective to bias the comparator to not generate the noise blanking signal when the voltage at the output of the voltage generator does not exceed the reference voltage.

2. A noise blanking signal generator for an AM radio receiver, comprising, in combination:
   a product detector adapted to receive an IF signal modulated by an AF signal and synchronously detect the AF signal, the product detector comprising a balanced modulator having a pair of balanced outputs, one of the outputs varying in a first direction from a fixed intermediate voltage and the other output correspondingly varying in a second direction from the fixed intermediate voltage;
   a first low pass filter adapted to derive from the first of the balanced outputs of the product detector a filtered voltage indicating the average IF signal strength by its variation from the fixed intermediate voltage;
   a second low pass filter adapted to derive from the second of the balanced outputs of the product detector an AF signal voltage;
   a reference voltage generating circuit ratiometrically related to the product detector through a common DC power supply and effective to generate a reference voltage substantially equal to the fixed intermediate voltage, the reference voltage thus being substantially equal to the filtered voltage in the absence of an IF signal;
   a voltage divider comprising a pair of resistors connected in series across the outputs of the first and second low pass filters and having an output at the junction of the resistors, the resistors having a resistance ratio $(1+m)/1$, where m is a predetermined modulation index of the IF signal modulated by the AF signal, so as to generate at the voltage divider output, when the modulation index of the modulated IF signal equals the predetermined modulation index, a voltage equal to the reference voltage;
   a comparator effective to compare the voltage at the output of the voltage divider with the reference voltage and generate a noise blanking signal when the former exceeds the latter; and
   offset means effective to bias the comparator to not generate the noise blanking signal when the voltage at the output of the voltage generator does not exceed the reference voltage.

3. A noise blanking signal generator for an AM radio with AGC comprising, in combination:
   a product detector adapted to receive an IF signal modulated by an AF signal and synchronously detect the AF signal;
   a first low pass filter adapted to derive from the product detector a filtered voltage indicating the average IF signal strength;
   a second low pass filter adapted to derive from the product detector an AF signal voltage;
   a reference voltage generating circuit ratiometrically related to the product detector through a common DC power supply and effective to generate first and second reference voltages ratiometrically related to each other, the first reference voltage being substantially equal to the filtered voltage in the absence of an IF signal and the second reference voltage being offset from the first reference voltage;
   a first comparator effective to compare the filtered voltage from the low pass filter with the second reference voltage;
   a capacitor;
   voltage translation means connected to the capacitor and responsive to the voltage thereon to output an AGC voltage;
   voltage limiting means adapted to limit the voltage on the capacitor to a predetermined maximum voltage;
   first and second current sources responsive to the first comparator, the first current source being adapted to change the charge on the capacitor in a first direction when the filtered voltage exceeds the medium reference voltage and the second current source being adapted to change the charge on the capacitor in the opposite direction when the filtered voltage is less than the medium reference voltage;

a voltage divider comprising a pair of resistors connected in series across the outputs of the first and second low pass filters and having an output at the junction of the resistors, the resistors being of such ratio as to generate, when the audio signal equals a predetermined modulation level with reference to the IF signal strength, a voltage equal to the reference voltage at the voltage divider output;

a second comparator effective to compare the voltage at the output of the voltage divider with the first reference voltage and generate a noise blanking signal when the former exceeds the latter; and offset means effective to bias the second comparator to not generate the noise blanking signal when the voltage at the output of the voltage generator does not exceed the first reference voltage.

4. A noise blanking signal generator for an AM radio with AGC comprising, in combination:

a product detector adapted to receive an IF signal modulated by an AF signal and synchronously detect the AF signal, the product detector comprising an IF limiter circuit effective to clip the IF signal and a balanced modulator comprising a common current source, a pair of input terminals and a pair of outputs having load resistors having equal first voltage drops thereacross, one of the outputs varying in a first direction from a fixed intermediate voltage and the other of the outputs correspondingly varying in the opposite direction from the fixed intermediate voltage, one of the inputs being provided with the IF signal and the other input being provided with the clipped IF signal;

a first low pass filter adapted to derive from one of the outputs of the product detector a filtered voltage indicating the average IF signal strength;

a second low pass filter adapted to derive from the other output of the product detector an AF signal voltage;

a reference voltage generating circuit ratiometrically related to the low pass filter through a common DC power supply and including a voltage divider comprising a plurality of resistors connected in series with a current source coupled to the common current source of the balanced modulator for ratiometric current supply with the junctions of the resistors providing connections for, in descending order, first, second, third, fourth and fifth reference voltages ratiometrically related to each other, the voltage divider defining the second reference voltage as equal to the fixed intermediate voltage, the first and fourth reference voltages as equal to the fixed intermediate voltage plus and minus, respectively, the filtered voltage representing the desired average IF signal strength and the third and fifth reference voltages as forming a voltage window about the fourth reference voltage;

comparator means comprising first, second and third differential comparators each a first input connected to the output of the first low pass filter and a second input connected to a different junction of the resistors of the reference voltage generating circuit defining, respectively, the fourth, third and fifth reference voltages;

a capacitor;

voltage translation means connected to the capacitor and responsive to the voltage thereon to output an AGC voltage;

voltage limiting means adapted to limit the voltage on the capacitor to a predetermined maximum voltage;

first and second current sources responsive to the first differential comparator, the first current source being adapted to change the charge on the capacitor in a first direction when the filtered voltage exceeds the fourth reference voltage and the second current source being adapted to change the charge on the capacitor in the opposite direction when the filtered voltage is less than the fourth reference voltage;

a fourth differential comparator having a common current source switched between conducting and non-conducting states by the second and third differential comparators when the filtered voltage is outside or within, respectively, the voltage window defined by the third and fifth reference voltages, a pair of input terminals, one of which is connected to one of the outputs of the balanced modulator and the other to the first reference voltage junction of the reference voltage generating circuit, and a pair of output terminals each effective, when activated, to increase, through a current mirror, the output of one of the first and second current sources, whereby the capacitor charge changes at a faster rate for faster AGC voltage change when the average IF signal strength is outside a predetermined range;

a voltage divider comprising a pair of resistors connected in series across the outputs of the first and second low pass filters and having an output at the junction of the resistors, the resistors having a resistance ratio of $(1+m)/1$, where m is a predetermined modulation index of the IF signal modulated by the AF signal, so as to generate, when the modulation index of the modulated IF signal equals the predetermined modulation index, a voltage equal to the reference voltage at the voltage divider output;

a fifth differential comparator effective to compare the voltage at the output of the voltage divider with the second reference voltage and generate a noise blanking signal when the former exceeds the latter; and offset means effective to bias the second comparator to not generate the noise blanking signal when the voltage at the output of the voltage generator does not exceed the first reference voltage.

* * * * *